US008546922B2

(12) United States Patent
Furutani et al.

(10) Patent No.: US 8,546,922 B2
(45) Date of Patent: Oct. 1, 2013

(54) WIRING BOARD

(75) Inventors: Toshiki Furutani, Ogaki (JP); Daiki Komatsu, Ogaki (JP); Nobuya Takahashi, Ogaki (JP); Masatoshi Kunieda, Ogaki (JP); Naomi Fujita, Ogaki (JP); Koichi Tsunoda, Ogaki (JP); Minetaka Oyama, Ogaki (JP); Toshimasa Yano, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/246,933

(22) Filed: Sep. 28, 2011

(65) Prior Publication Data
US 2012/0175754 A1     Jul. 12, 2012

Related U.S. Application Data

(60) Provisional application No. 61/388,084, filed on Sep. 30, 2010.

(51) Int. Cl.
*H01L 23/495*       (2006.01)
*H05K 1/18*          (2006.01)

(52) U.S. Cl.
USPC .... 257/668; 257/698; 257/700; 257/E23.036; 257/E23.125; 361/761; 361/782

(58) Field of Classification Search
USPC ................. 257/698, 668, 687, 690, 701–703, 257/E23.009, E23.011, E23.036, E23.067, 257/E23.125; 361/761, 782
See application file for complete search history.

(56) References Cited

U.S. PATENT DOCUMENTS

| 6,590,291 | B2 * | 7/2003 | Akagawa ................. 257/774 |
| 7,145,228 | B2 * | 12/2006 | Yean et al. .............. 257/698 |
| 7,199,459 | B2 * | 4/2007 | Pu et al. ................. 257/686 |
| 2004/0070064 | A1 * | 4/2004 | Yamane et al. ............ 257/686 |
| 2005/0161803 | A1 * | 7/2005 | Mihara .................. 257/698 |
| 2009/0309202 | A1 * | 12/2009 | Hsu et al. ................ 257/680 |
| 2010/0078205 | A1 |  4/2010 | Sakai et al. |

FOREIGN PATENT DOCUMENTS

WO        WO 01/63991 A1      8/2001

OTHER PUBLICATIONS

U.S. Appl. No. 13/249,838, filed Sep. 30, 2011, Furutani, et al.

* cited by examiner

*Primary Examiner* — Jasmine Clark
(74) *Attorney, Agent, or Firm* — Oblon, Spivak, McClelland, Maier & Neustadt, L.L.P.

(57) ABSTRACT

A wiring board including a core substrate made of an insulative material and having a penetrating portion, a first interlayer insulation layer formed on the surface of the core substrate, a first conductive circuit formed on the surface of the first interlayer insulation layer, a first via conductor formed in the first interlayer insulation layer, and an electronic component accommodated in the penetrating portion of the core substrate and including a semiconductor element, a bump body mounted on the semiconductor element, a conductive circuit connected to the bump body, an interlayer resin insulation layer formed on the conductive circuit, and a via conductor formed in the interlayer resin insulation layer. The first via conductor has a tapering direction which is opposite of a tapering direction of the via conductor in the electronic component.

20 Claims, 6 Drawing Sheets

:

WIRING BOARD

CROSS-REFERENCE TO RELATED APPLICATIONS

The present application claims the benefits of priority to U.S. Application No. 61/388,084, filed Sep. 30, 2010. The contents of that application are incorporated herein by reference in their entirety.

BACKGROUND OF THE INVENTION

1. Field of the Invention

The present invention relates to a wiring board with a built-in semiconductor device having a semiconductor element and to a method for manufacturing such a wiring board.

2. Discussion of the Background

WO 01/63991 A1 discloses a structure in which a semiconductor element which would conventionally be mounted on a wiring board is accommodated in the wiring board. The contents of this publication are incorporated herein by reference in their entirety.

SUMMARY OF THE INVENTION

According to one aspect of the present invention, a wiring board includes a core substrate made of an insulative material and having a penetrating portion, a first interlayer insulation layer formed on the surface of the core substrate, a first conductive circuit formed on the surface of the first interlayer insulation layer, a first via conductor formed in the first interlayer insulation layer, and an electronic component accommodated in the penetrating portion of the core substrate and including a semiconductor element, a bump body mounted on the semiconductor element, a conductive circuit connected to the bump body, an interlayer resin insulation layer formed on the conductive circuit, and a via conductor formed in the interlayer resin insulation layer. The first via conductor has a tapering direction which is opposite of a tapering direction of the via conductor in the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
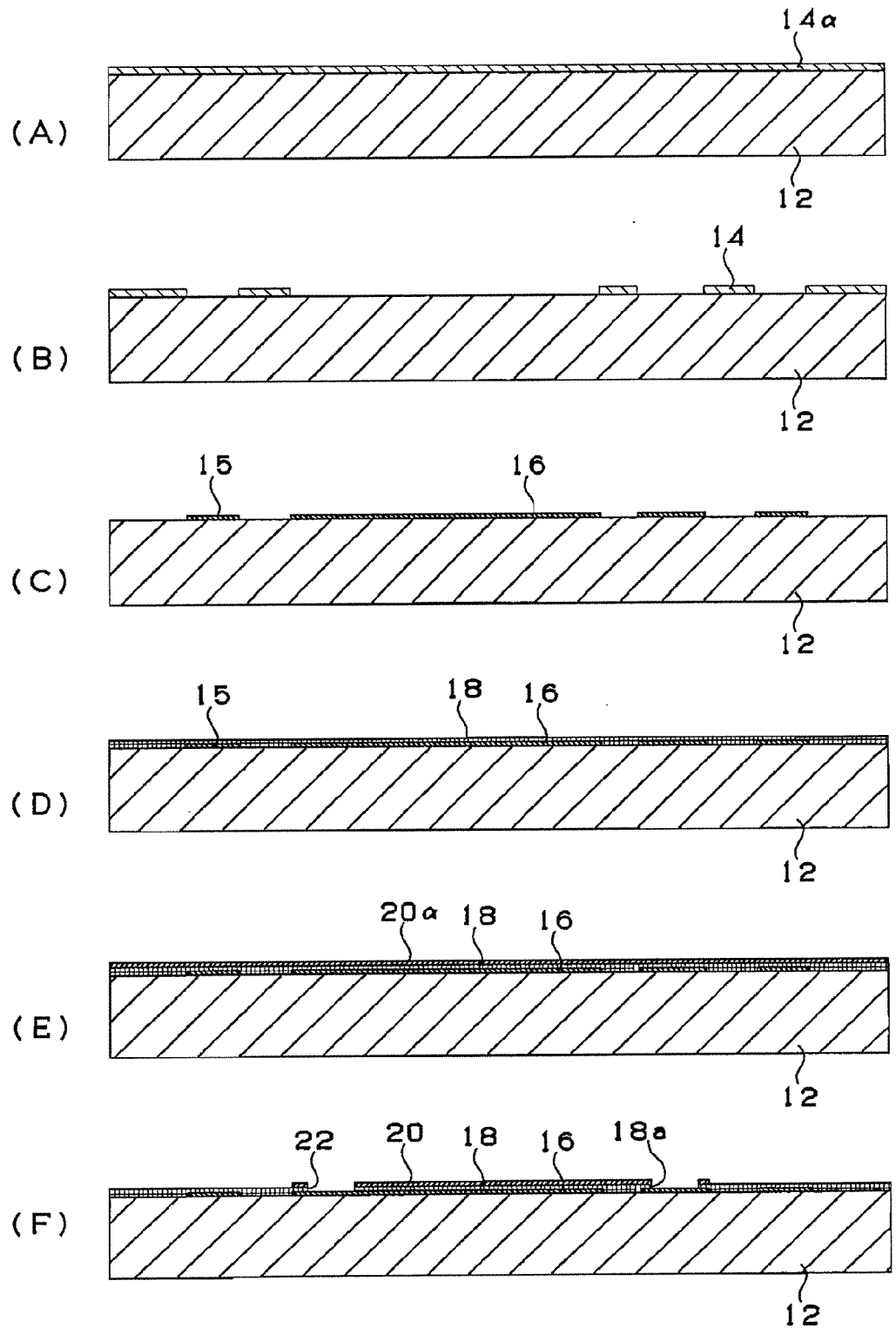
FIGS. 1(A)-1(F) are views showing steps for manufacturing an electronic component of the present embodiment.

The embodiments will now be described with reference to the accompanying drawings, wherein like reference numerals designate corresponding or identical elements throughout the various drawings.

Figure 6:
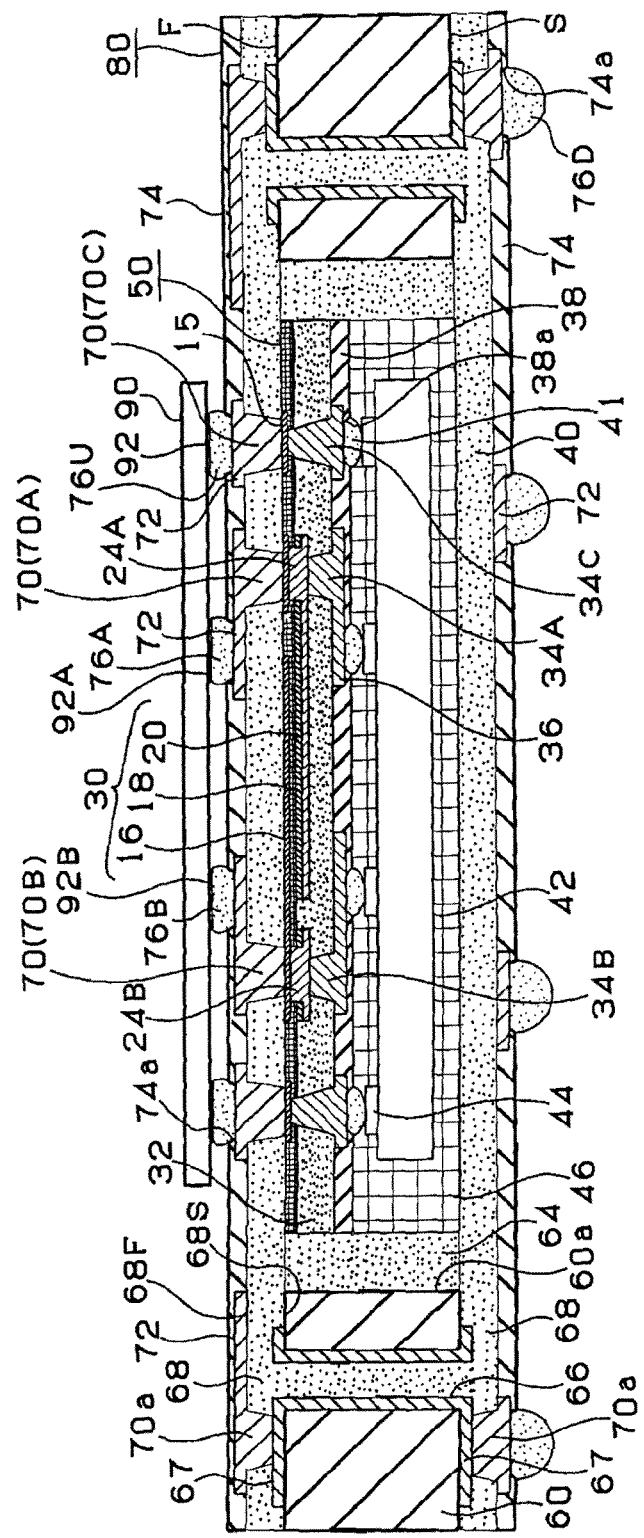
FIG. 6 is a cross-sectional view of a wiring board according to the present embodiment.

A wiring board according to an embodiment of the present invention and an electronic component to be accommodated in the wiring board are described with reference to FIGS. 6 and 3(D). FIG. 6 shows a cross-sectional view of wiring board 80 of the present embodiment.

Wiring board 80 has core substrate 60 (insulative material) having penetrating section (60a), electronic component 50 containing semiconductor element 42 in penetrating section (60a), and semiconductor element 90 mounted on the upper surface. Filler 64 is filled between penetrating section (60a) of core substrate 60 and electronic component 50. Filler 64 is made of a material having a lower thermal expansion coefficient than interlayer resin insulation layers 68.

First, electronic component 50 is described. As shown in FIG. 3(D), electronic component 50 has buildup section 40 in which conductive circuits 36 formed on the upper-surface side (second-surface side) of insulation layer 32 and conductive circuits 15 formed on the lower-surface side (first-surface side) are connected through via conductors 34. Solder-resist layer 38 with openings (38a) is formed on buildup section 40. Solder bumps 41 are formed in openings (38a) which expose portions of conductive circuits 36, and semiconductor element 42 is mounted through solder bumps 41. Semiconductor element 42 is encapsulated with molding resin 46. In buildup section 40, thin-film capacitor section 30 is formed with dielectric layer 18 and first layered electrode 16 and second layered electrode 20 sandwiching dielectric layer 18. Ground terminals (24A) are connected to first layered elecctrode 16, and are connected to conductive circuits 36 through via conductors (34A) (second via conductors). Power-source terminals (24B) are connected to second layered electrode 20, and are connected to conductive circuits 36 through via conductors (34B). Via conductors (34A), via conductors (34B) and via conductors (34C) formed in insulation layer 32 have a greater diameter on the second-surface side (upper-surface side) of insulation layer 32 than on the first-surface side (lower-surface side). Namely, via conductors (34A~34C) are shaped to taper with a diameter decreasing from the second-surface side (upper-surface side) of insulation layer 32 toward the first-surface side (lower-surface side).

Next, wiring board 80 containing electronic component 50 is described with reference to FIG. 6. Wiring board 80 contains core substrate 60 having first surface (F) and second surface (S) opposite first surface (F). Conductive circuits (67, 67) are formed on first surface (F) and second surface (S) of core substrate 60. Conductive circuits (67, 67) are connected to each other by through-hole conductors 66 formed in core substrate 60.

Moreover, penetrating section (60a) is formed in core substrate 60. Electronic component 50 is accommodated in penetrating section (60a). At that time, electronic component 50 is accommodated so that the surface of molding resin 46 is positioned on the second-surface (S) side of core substrate 60. More specifically, electronic component 50 is accommodated so that the surface of molding resin 46 is positioned on substantially the same plane as the second surface (S) of core substrate 60. Also, filler 64 is filled between side walls of penetrating section (60a) and electronic component 50. Electronic component 50 is fixed in penetrating section (60a) by filler 64.

Interlayer resin insulation layer 68 (first interlayer insulation layer) is formed on first surface (F) of core substrate 60 and on electronic component 50. Conductive circuits 72 are formed on first surface (68F) of interlayer resin insulation layer 68. Second surface (68S) of interlayer resin insulation layer 68 faces first surface (F) of the core substrate (the second surface of interlayer resin insulation layer 32). In addition, first via conductors 70 (70A, 70B, 70C) are formed in interlayer resin insulation layer 68. Via conductors (70B) are such via conductors that connect conductive circuits 72 and first layered electrode 16 through power-source terminals (24B). Via conductors (70A) are such via conductors that connect conductive circuits 72 and second layered electrode 20 through ground terminals (24A). Via conductors (70C) are signal conductors that connect conductive circuits 72 and conductive circuits 36 through via conductors 34.

Those first via conductors 70 (70A, 70B, 70C) have a greater diameter on the first-surface side of the interlayer resin insulation layer than on the second-surface side. Namely, first via conductors 70 (70A, 70B, 70C) have side surfaces tapering in a direction opposite that of second via conductors 34 (34A, 34B, 34C).

At that time, power-source via conductor (70A) and via conductor (34A) are preferred to be aligned in a straight line (their central lines overlap). Moreover, ground via conductor (70B) and via conductor (34B) are preferred to be aligned in a straight line (their central lines overlap). In such a case, the wiring distance between semiconductor elements decreases, and instantaneous power supply from thin-film capacitor section 30 is achieved without loss.

Solder-resist layer 74 with openings (74a) is formed on the first surface of interlayer resin insulation layer 68. Solder bumps (76U) are formed on conductive circuits 72 exposed through openings (74a). Semiconductor element 90 is mounted on wiring board 80 through solder bumps (76U).

In wiring board 80, one of semiconductor elements (42, 90) is a memory and the other is a CPU. Since semiconductor element 90 (a CPU, for example) is mounted on the upper side of semiconductor element 42 (a memory, for example), the distance between memory 42 and CPU 90 decreases, the length of signal line is reduced, and thus high-speed signal transmission is achieved.

Furthermore, there are the following effects. In wiring board 80 of the first embodiment, via conductors 34 formed in insulation layer 32 are shaped to taper with a diameter decreasing toward the upper side, whereas via conductors 70 formed in insulation layer 68 are shaped to taper with a diameter decreasing toward the lower side. Namely, via conductors 34 formed in insulation layer 32 and via conductors 70 formed in interlayer resin insulation layer 68 taper in opposite directions. Thus, the directions of warping occurring in insulation layer 32 and insulation layer 68 are opposite and offset the generated stresses from each other. As a result, wiring board 80 is effectively suppressed from warping. Accordingly, mountability of the semiconductor element 90 is improved. Moreover, if thermal stress is generated by the added heat for reflowing when mounting semiconductor element 90, for example, the reliability of electronic component 50 is ensured.

Furthermore, since large-capacity capacitor section 30 is provided directly beneath semiconductor element 90 (such as a CPU), the decrease in voltage is less even if great power is consumed instantaneously at semiconductor element 90, allowing semiconductor element 90 to operate properly.

Figure 2:
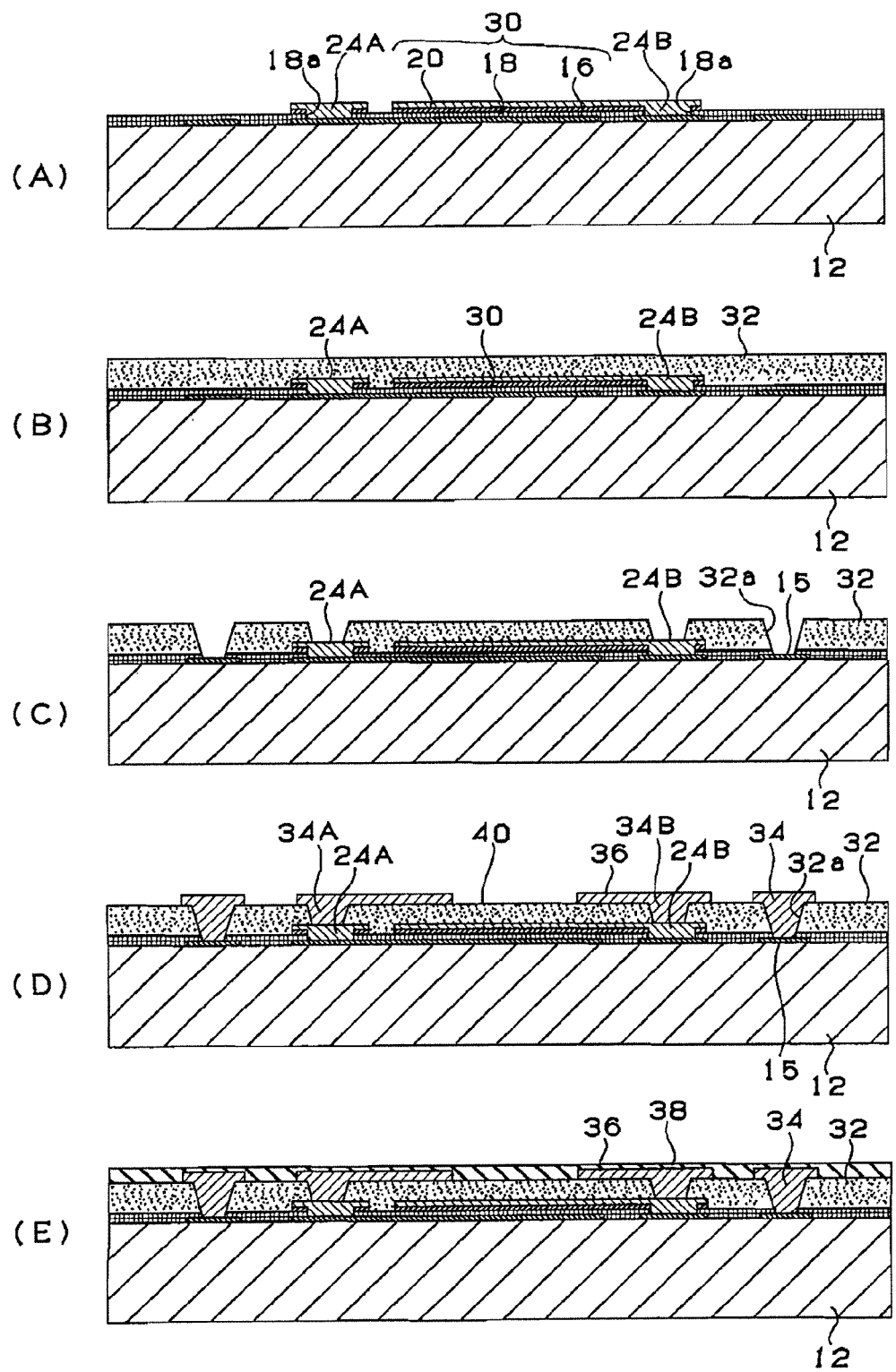
FIGS. 2(A)-2(E) are views showing steps for manufacturing an electronic component of the present embodiment.
Figure 3:
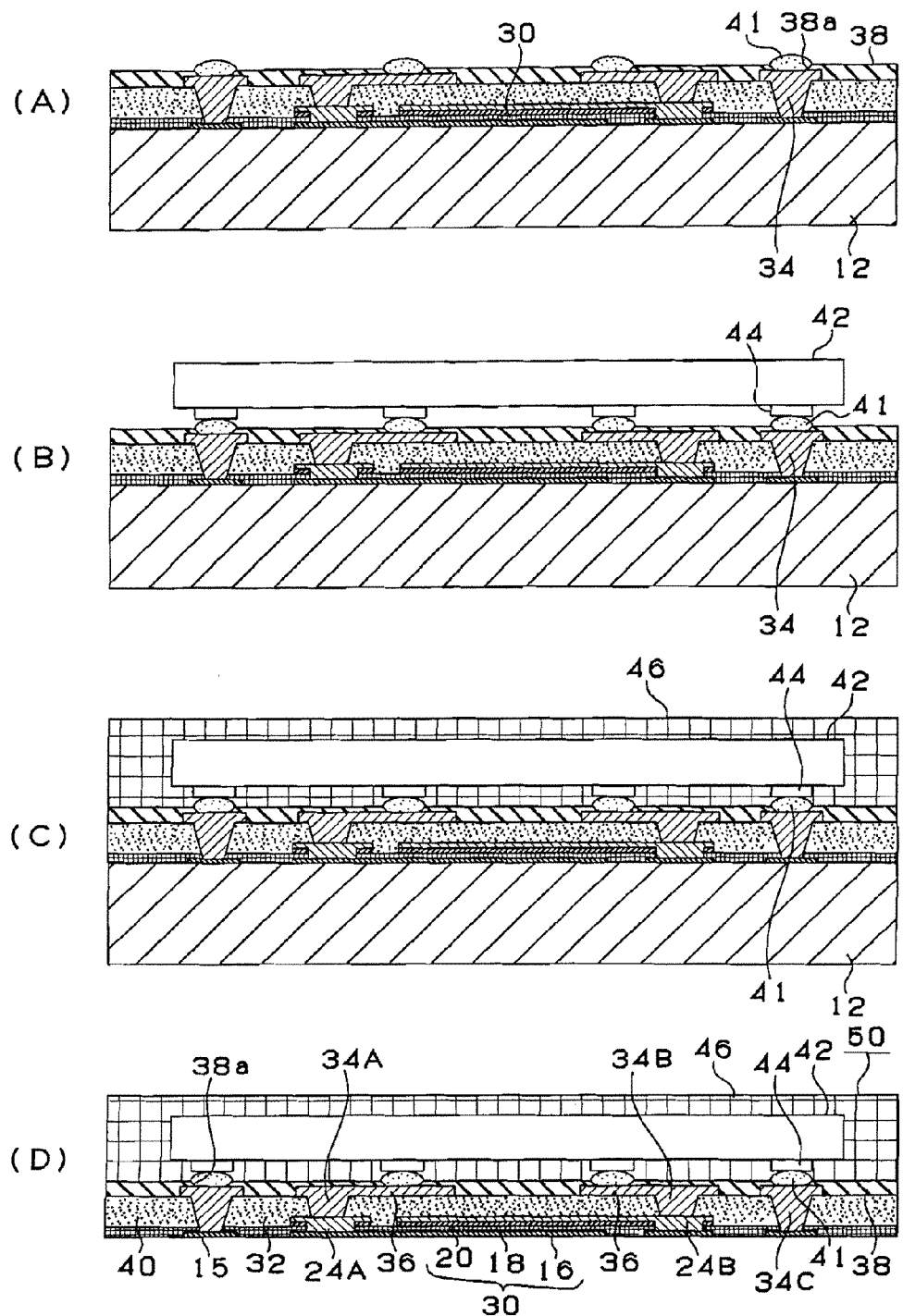
FIGS. 3(A)-3(D) are views showing steps for manufacturing an electronic component of the present embodiment.

Next, a method for manufacturing electronic component 50 of the first embodiment is described with reference to FIGS. 1-3. Resist solution (14a) is applied on support substrate 12 (glass substrate or silicon substrate) (FIG. 1(A)) and patterned to form resist 14 (FIG. 1(B)). Conductive circuits 15 and first layered electrode 16 are formed by TiN/W sputtering and the resist is removed (FIG. 1(C)).

A high-dielectric-constant material is printed to be a thin film 0.1~10 μm thick on first layered electrode 16 using a printer such as a roll coater, doctor blade or the like, and an uncalcined layer is formed. After printing, the uncalcined layer is calcined in a vacuum or in a non-oxygen atmosphere such as $N_2$ gas at a temperature range of 600~950° C. to form dielectric layer 18 (FIG. 1(D)). As for a high-dielectric-constant material, a metal oxide containing one kind or two or more kinds selected from the following may be used: barium titanate, strontium titanate, tantalum oxide, lead zirconate titanate, lead lanthanum zirconate titanate, lead niobium zirconate titanate, lead calcium zirconate titanate and lead strontium zirconate titanate. Accordingly, a high dielectric constant is obtained.

By TiN/W sputtering, metal film (20α) is formed on dielectric layer 18 to become the second layered electrode (FIG. 1(E)). The metal film is patterned and penetrating holes (18a) are formed at predetermined spots in dielectric layer 18. Accordingly, second layered electrode 20 is formed on dielectric layer 18 (FIG. 1(F)). By forming conductors in penetrating holes (18a), ground terminals (24A) to be connected to first layered electrode 16 which becomes the ground layer, and power-source terminals (24B) to be connected to second layered electrode 20 which becomes an electrode layer are formed. Accordingly, capacitor section 30 is formed where dielectric layer 18 is sandwiched by first layered electrode 16 and second layered electrode 20 (FIG. 2(A)).

Insulation layer 32 made of resin containing particles soluble in a chemical solution and inorganic particles is formed on thin-film capacitor section 30 (FIG. 2(B)). By using a laser, openings (32a) are formed in insulation layer 32 to reach conductive circuits 15, ground terminals (24A) and power-source terminals (24B) (FIG. 2(C)). After the surface of insulation layer 32 is roughened by being treated with a chemical solution to dissolve the soluble particles on the surface, electroless plated film is formed, plating resist with a predetermined pattern is formed, and electrolytic plated film is formed. Then, by peeling the plating resist and removing the electroless plated film under the plating resist, via conductors 34 reaching conductive circuits 15, via conductors (34A) reaching ground terminals (24A), via conductors (34B) reaching power-source terminals (24B), and conductive circuits 36 on the insulation layer are formed (FIG. 2(D)). Accordingly, buildup section 40 is completed, being formed with conductive circuits 15, insulation layer 40, conductive circuits 36 and via conductors (34, 34A, 34B).

Conductive circuits 36 on insulation layer 32 are coated with solder-resist layer 38 (FIG. 2(E)), openings (38a) are formed in solder-resist layer 38, and solder paste is printed in the openings and reflowed. Accordingly, solder bumps 41 are formed (FIG. 3(A)).

Terminals 44 of semiconductor element 42 are mounted on solder bumps 41 (FIG. 3(B)). Then, semiconductor element 42 is encapsulated with molding resin 46 (FIG. 3(C)), and support substrate 12 is removed. Finally, electronic component 50 is completed (FIG. 3(D)).

Figure 4:
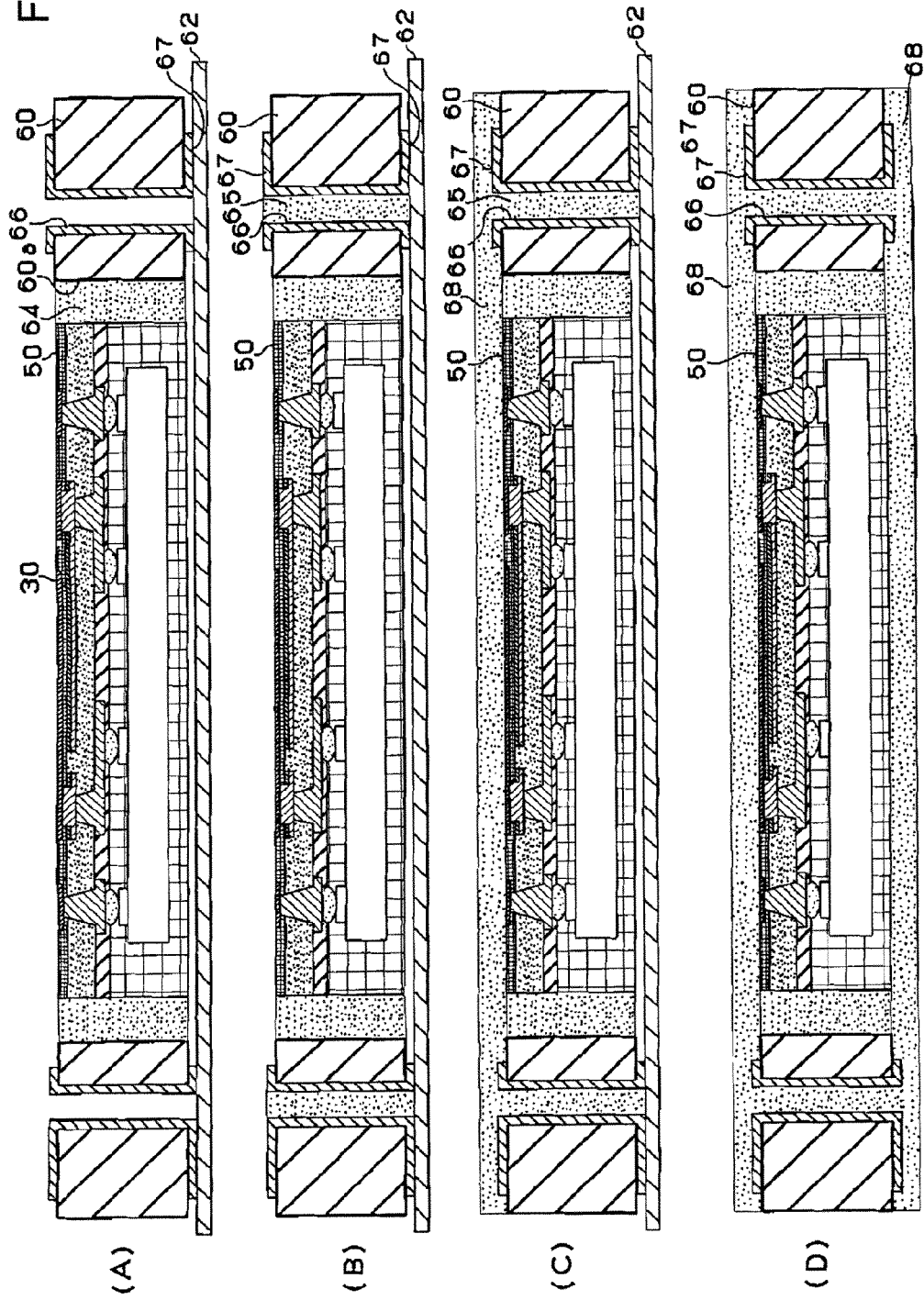
FIGS. 4(A)-(D) are views showing steps for manufacturing a wiring board of the present embodiment.
Figure 5:
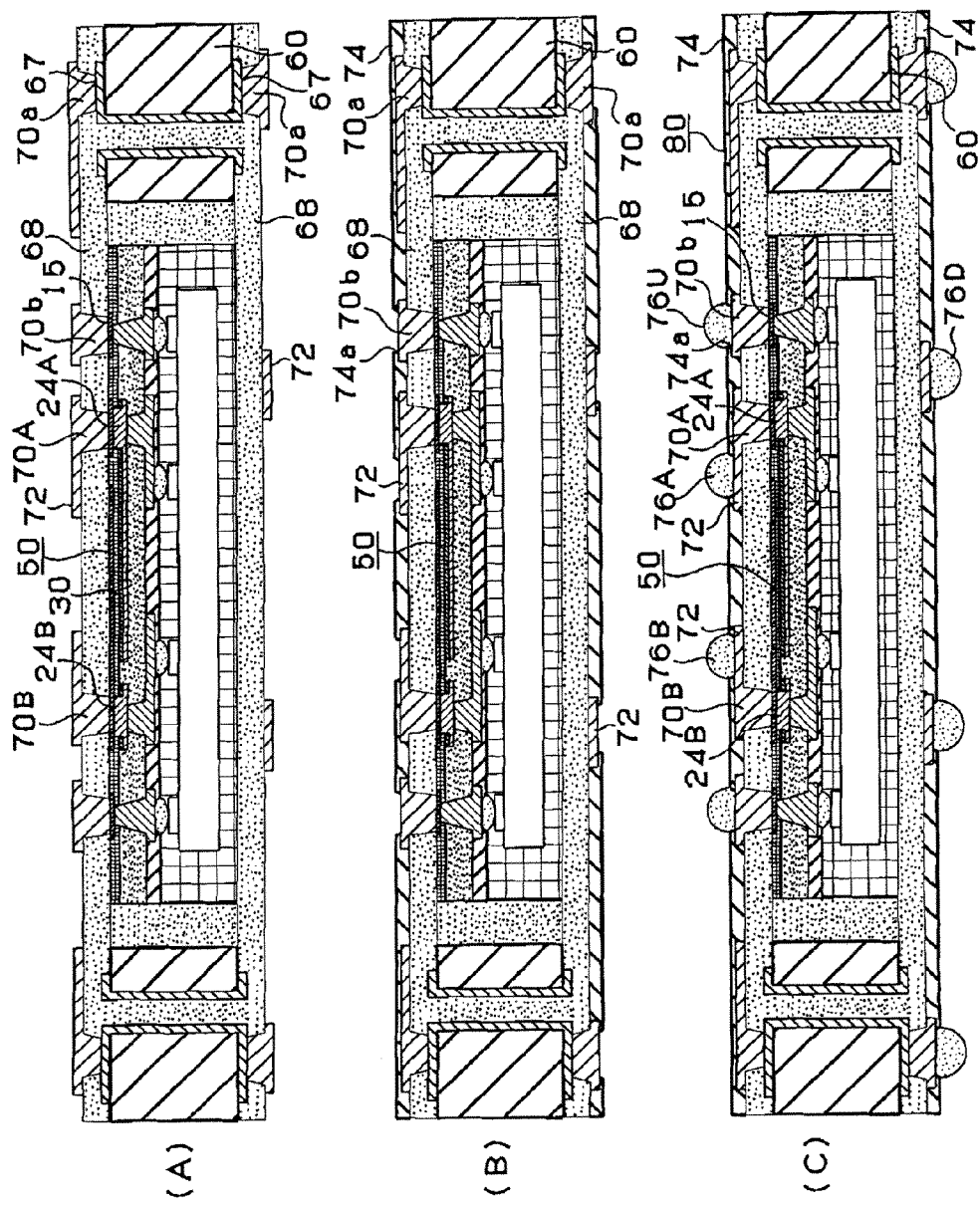
FIGS. 5(A)-(C) are views showing steps for manufacturing a wiring board of the present embodiment.

In the following, a method for manufacturing a wiring board with built-in electronic component 50 is described with reference to FIGS. 4~6.

(1) First, core substrate 60 is prepared. Core substrate 60 is made of 0.2~0.8 mm-thick glass-epoxy resin or BT (bismaleimide triazine) resin, and has penetrating section (60a) and through-hole conductors 66. Such core substrate 60 is placed on support material 62. Next, electronic component 50 is accommodated in penetrating section (60a). At that time, the molded-resin surface of electronic component 50 is positioned to face the lower side. Then, filler 64 is filled between penetrating section (60a) and electronic component 50 (FIG. 4(A)).

(2) As shown in FIG. 4(B), filling material 65 is filled inside through-hole conductors 66.

(3) Next, as shown in FIG. 4(C), resin film for resin insulation layers (brand name ABF-45SH, made by Ajinomoto) is placed on the first surface of core substrate 60, preliminarily pressed and cut to size. Then, the film is laminated using a vacuum laminator to form interlayer resin insulation layer 68. After that, support material 62 is removed from core substrate 60, and interlayer resin insulation layer 68 is also formed on the second surface of core substrate 60 (FIG. 4(D)).

(4) Next, via-hole openings are formed in interlayer resin insulation layers 68 by a CO2 gas laser. The substrate with via-hole openings is immersed for 10 minutes in an 80° C. solution containing 60 g/l permanganic acid. Then, particles present on the surfaces of interlayer resin insulation layers are removed to roughen the surfaces of interlayer resin insulation layers including the inner walls of via-hole openings (not shown in the drawings). Next, the substrate is immersed in a neutralizer (made by Shipley Company) and washed with water. Furthermore, by applying a palladium catalyst to the roughened surfaces of the substrate, catalytic nuclei are attached to the surfaces of interlayer resin insulation layers and inner-wall surfaces of via-hole openings.

Next, the substrate with the attached catalyst is immersed in an electroless copper plating solution (Thru-Cup PEA) made by C. Uyemura & Co., Ltd. to form 0.3~3.0 µm-thick electroless copper-plated film on the entire roughened surface; electroless copper-plated film is formed on the surfaces of interlayer resin insulation layers 68 including the inner walls of via-hole openings (68a). A commercially available photosensitive dry film is laminated on the substrate with electroless copper-plated film, and a mask is placed on the dry film, which is then exposed to light and developed. Accordingly, plating resists are formed. Then, after the substrate is degreased, washed with water, and further cleansed with sulfuric acid, electrolytic plating is performed to form electrolytic copper-plated film in portions where plating resists are not formed.

After the plating resists are removed, electroless plated films under the plating resists are etched to be dissolved and removed. Formed accordingly are conductive circuits 72 made of electroless plated film and electrolytic plated film, via conductors (70a) to be connected to conductive circuits 67 of core substrate 60, via conductors (70b) to be connected to conductive circuits 15 on the side of electronic component 50, ground via conductors (70A) to be connected to ground terminals (24A) of thin-film capacitor section 30, and power-source via conductors (70B) to be connected to power-source terminals (24B) of thin-film capacitor section 30 (FIG. 5(A)). Then, surfaces of conductive circuits 72 are roughened (not shown in the drawings).

(5) Next, a commercially available solder-resist composition is applied on both surfaces of the substrate to be 20 µm thick, and dried. Next, solder resist is cured by irradiating a laser at the solder-resist composition except for opening portions. Then, by removing the uncured portions of the solder resist using a chemical solution, solder-resist layers 74 are formed having openings (74a) and being 15~25 µm thick (FIG. 5(B)).

(6) Next, the substrate with solder-resist layers 74 is immersed in an electroless nickel plating solution to form a 5 µm-thick nickel-plated layer in opening portions (74a, 74a) (not shown in the drawings). Furthermore, the substrate is immersed in an electroless gold plating solution to form a 0.03 µm-thick gold-plated layer on the nickel-plated layer (not shown in the drawings). Accordingly, solder pads are formed. Instead of nickel-gold layers, nickel-palladium-gold layers may also be formed.

(7) By printing and reflowing solder paste in openings (74a) in the solder-resist layers of wiring board 80, the following are formed on the upper-surface side: solder bump (76U) on conductive circuit 72 connected to via conductor (70b) which reaches conductive circuit 15; solder bump (76A) on conductive circuit 72 connected to ground via conductor (70A) which reaches ground terminal (24A); and power-source solder bump (76B) on conductive circuit 72 connected to power-source via conductor (70B) which reaches power-source terminal (24B). In openings of solder-resist layer 74 on the lower-surface side, solder bumps (76D) are formed (FIG. 5(C)).

Then, semiconductor element 90 is mounted on wiring board 80 through solder bumps (76U) (FIG. 6).

A wiring board according to the present invention is technically characterized by the following: an insulative material with a first surface and a second surface opposite the first surface and having a penetrating section; an electronic component accommodated in the penetrating section; a first interlayer insulation layer formed on the first surface of the core substrate and on the electronic component and having a first surface and a second surface opposite the first surface; a first conductive circuit formed on the first surface of the first interlayer insulation layer; and a first via conductor formed in the first interlayer insulation layer. In such a wiring board, the electronic component has a second interlayer insulation layer with a first surface facing the second surface of the first interlayer insulation layer and a second surface opposite the first surface; a second conductive circuit formed on the second surface of the second interlayer insulation layer; a second via conductor formed in the second interlayer insulation layer; a bump body formed on the second conductive circuit; and a semiconductor element mounted on the second surface of the second interlayer insulation layer through the bump body, the first via conductor has a greater diameter on the first-surface side of the first interlayer insulation layer than on the second-surface side, and the second via conductor has a greater diameter on the second-surface side of the second interlayer insulation layer than on the first-surface side.

In a wiring board according to an embodiment of the present invention, the electronic component accommodated in the insulative material has second via conductors whose tapering direction is opposite that of first via conductors formed in the upper layer. Thus, the directions of warping that occurs in the first interlayer insulation layer and the second interlayer insulation layer are opposite and offset generated stresses from each other. As a result, the wiring board itself seldom warps even while another semiconductor element is being mounted on the wiring board, for example. Accordingly, mounting a semiconductor element in a preferred way is ensured.

In the above embodiment, an example has been described in which a CPU chip and a memory chip are mounted as semiconductor chips. However, various chips may be mounted on the wiring board according to the present invention. In addition, a thin-film capacitor section may be omitted.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a core substrate comprising an insulative material and having a penetrating portion;
a first interlayer insulation layer formed on a surface of the core substrate;
a first conductive circuit formed on a surface of the first interlayer insulation layer;
a first via conductor formed in the first interlayer insulation layer; and
an electronic component accommodated in the penetrating portion of the core substrate and comprising a semiconductor element, a bump body mounted on the semiconductor element, a conductive circuit connected to the bump body, an insulation layer formed on the conductive circuit, and a via conductor formed in the insulation layer,
wherein the first via conductor has a tapering direction which is opposite of a tapering direction of the via conductor formed in the insulation layer of the electronic component.

2. The wiring board according to claim 1, wherein the first via conductor is formed such that the first via conductor has a diameter which becomes greater toward the first conductive circuit on the surface of the first interlayer insulation layer.

3. The wiring board according to claim 1, wherein the first via conductor is directly connected to the via conductor in the electronic component.

4. The wiring board according to claim 1, wherein the electronic component includes a thin-film capacitor comprising a first layered electrode, a second layered electrode and a dielectric layer formed between the first and second layered electrodes.

5. The wiring board according to claim 4, wherein the thin-film capacitor is formed in a portion of the insulation layer directly above the semiconductor element.

6. The wiring board according to claim 1, wherein the electronic component has an encapsulating material encapsulating the semiconductor element.

7. The wiring board according to claim 1, further comprising a filler filled inside the penetrating portion and fixing the electronic component.

8. The wiring board according to claim 7, wherein the filler is made of a material having a thermal expansion coefficient which is lower than a thermal expansion coefficient of the first interlayer insulation layer.

9. The wiring board according to claim 1, further comprising a second semiconductor element mounted on the first conductive circuit.

10. The wiring board according to claim 1, further comprising a second semiconductor element mounted on the first conductive circuit and directly above the semiconductor element of the electronic component.

11. The wiring board according to claim 1, wherein the core substrate has a through-hole conductor extending through the core substrate for electrical connection.

12. The wiring board according to claim 2, wherein the first via conductor is directly connected to the via conductor in the electronic component.

13. The wiring board according to claim 2, wherein the electronic component includes a thin-film capacitor comprising a first layered electrode, a second layered electrode and a dielectric layer formed between the first and second layered electrodes.

14. The wiring board according to claim 13, wherein the thin-film capacitor is formed in a portion of the insulation layer directly above the semiconductor element.

15. The wiring board according to claim 2, wherein the electronic component has an encapsulating material encapsulating the semiconductor element.

16. The wiring board according to claim 2, further comprising a filler filled inside the penetrating portion and fixing the electronic component.

17. The wiring board according to claim 16, wherein the filler is made of a material having a thermal expansion coefficient which is lower than a thermal expansion coefficient of the first interlayer insulation layer.

18. The wiring board according to claim 2, further comprising a second semiconductor element mounted on the first conductive circuit.

19. The wiring board according to claim 2, further comprising a second semiconductor element mounted on the first conductive circuit and directly above the semiconductor element of the electronic component.

20. The wiring board according to claim 2, wherein the core substrate has a through-hole conductor extending through the core substrate for electrical connection.

* * * * *